United States Patent [19]

Kotera et al.

[11] Patent Number: 4,555,643
[45] Date of Patent: Nov. 26, 1985

[54] SUPERCONDUCTING LOGIC CIRCUIT AND SUPERCONDUCTING SWITCHING DEVICE THEREFOR

[75] Inventors: Nobuo Kotera; Yuji Hatano, both of Kokubunji; Atsushi Asano, Hachioji; Ushio Kawabe, Hamuramachi, all of Japan

[73] Assignee: Hitachi, Ltd., Tokyo, Japan

[21] Appl. No.: 391,716

[22] Filed: Jun. 24, 1982

[30] Foreign Application Priority Data

Jul. 1, 1981 [JP] Japan .................. 56-101221

[51] Int. Cl.⁴ .......................................... H03K 19/195
[52] U.S. Cl. ...................................... 307/476; 307/306
[58] Field of Search .................... 307/462, 476, 306; 357/5; 365/160, 162

[56] References Cited

U.S. PATENT DOCUMENTS

| | | | |
|---|---|---|---|
| 4,012,642 | 3/1977 | Guéret | 307/306 |
| 4,149,097 | 4/1979 | Faris | 307/306 |
| 4,313,066 | 1/1982 | Gheewala | 307/462 |
| 4,400,631 | 8/1983 | Fulton | 307/476 |
| 4,413,196 | 11/1983 | Josephs et al. | 307/462 |
| 4,482,821 | 11/1984 | Houkawa et al. | 307/306 |

Primary Examiner—John Zazworsky
Attorney, Agent, or Firm—Antonelli, Terry & Wands

[57] ABSTRACT

A superconducting logic circuit including a first power source terminal connected with a current source; a second power source terminal connected with a current sink; a first superconducting switching device connected between said first power source terminal and ground; a second superconducting switching device connected between said second power source terminal and ground; first and second resistors connected with said first and second power source terminals, respectively; and third and fourth resistors connected with the control terminals of said first and second superconducting switching devices, respectively, wherein the other terminals of said first and second resistors are connected with each other to provide a logic output terminal, and wherein the other terminals of said third and fourth resistors are connected with each other to provide a logic input terminal.

10 Claims, 13 Drawing Figures

SUPERCONDUCTING LOGIC CIRCUIT AND SUPERCONDUCTING SWITCHING DEVICE THEREFOR

BACKGROUND OF THE INVENTION

1. Field of the Invention

The present invention relates to a superconducting logic circuit, which utilizes Josephson junctions so that it can be driven by a d.c. power source, and a switching device for use therewith. The circuit of the present invention is of the type, which is completely symmetric with respect to the grounded point and in which a signal current is injected directly into a switching device. The logic circuit of the present invention can be used as an integrated circuit for composing a high speed computer.

2. Description of the Prior Art

Figure 1:
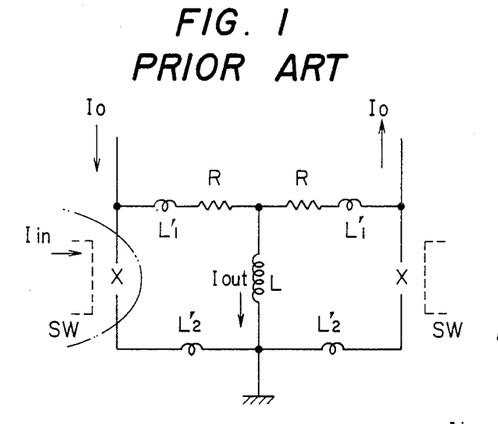
FIGS. 1 to 4 are circuit diagrams showing examples according to the prior art.

Most of the circuits utilizing Josephson junctions make the existence of a current signal correspond to logic values "1" and "0" but can make positive and negative currents correspond to the values "1" and "0" in accordance with the direction of the current. As one of those circuits, there has been known in the prior art a HUFFLE (an abbreviation of Hybrid Unlatching Flip-Flop Logic Elements) circuit (which should be referred to: A. E. Hebard, et al. "ADC-Powered Josephson flip-flop", IEEE Trans. MAG-15, [1]408(1979); T. A. Fulton, et al, "Josephson junction current-switched logic circuits", IEEE Trans. MAG-15, [6]1876(1979); and S. S. Pei, "Current-switched Josephson flip-flop logic", 1979-MTT-S, International Microwave Symposium Digest, 21). This HUFFLE circuit is driven by a current source and a current sink, as shown in FIG. 1. The HUFFLE circuit is featured by the fact that those power sources may be of d.c. type. With the respective power source terminals, there are connected two superconducting switching devices which are indicated at SW and which have their other terminals grounded. With those power source terminals, moreover, there are connected two identical resistors R which have their other terminals connected with each other to provide an output terminal. As a result, a positive or negative output current $I_{out}$ is generated at an inductive load (which has an inductance L) in response to the input signals of the switching devices which are located at the righthand and lefthand sides of the drawing. This drawing shows an example, in which one of the simplest Josephson junctions (which are indicated at X in the drawing) is used as the switching device, as a representative. At this time, the input signal currents flow through the control lines, which are indicated at broken lines in the drawing, so that magnetic fluxes are generated to exert influences upon the operations of the junctions. Now, if the lefthand junction is fed with an input so that it is transferred from a superconducting state (i.e., a 0 voltage state) to a voltage state, the current $I_o$ of the lefthand current source cannot flow directly to the grounded point but flows through the load inductance L so that the positive output current $I_{out}$ is derived. Since, at this time, the righthand junction is at its superconducting state, the current of the righthand current source flows as it is from the grounded point to the power source but does not appear at the output terminal. At a next step, if the righthand junction is fed with an input so that it is transferred to a voltage state, the opposite state to the above comes into effect. As a result, the current of the sink source flows through the load inductance L so that the negative output current $I_{out}$ is derived. This fact that the lefthand junction is returned to its voltage state at the instant of the transfer is the most fundamental feature of the operations of the HUFFLE circuit. As has been briefly described in the above, the known HUFFLE circuit has the two separate input terminals so that it can generate, when either (not both) of its input terminals receives an input signal, an output signal corresponding to the input signal, and can maintain that state even after the input disappears. As a result, the HUFFLE circuit can be used as a flip-flop circuit. In FIG. 1, there are shown parasitic inductances $L_1'$ and $L_2'$ which accompany the junction circuit but may be essentially considered not to exist (or to be zero). In case the HUFFLE circuit thus far described is used as a logic gate, there arises a following problem. In the aforementioned example, if the first input is fed to the lefthand switching device, a subsequent second input has to be impressed upon the righthand switching device after lapse of a certain time. If the second input is impressed upon the lefthand switching device, the circuit has a defect that it does not respond. In order to eliminate this defect, complementary inputs may be always (or simultaneously) impressed upon the righthand and lefthand input terminals. More specifically, it is sufficient that a logic value "1" (or "0") is never fed to the lefthand input terminal but a logic value "0" (or "1") is simultaneously fed to the righthand input terminal. From the standpoint of the construction of a logic circuit, however, it is highly wastefull to prepare the aforementioned "complementary input signals" at all times.

Figure 2:
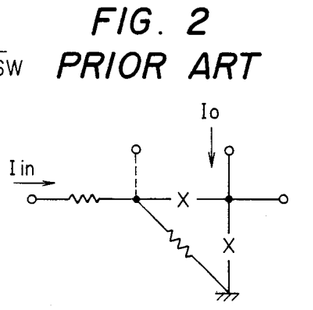
Figure 3:
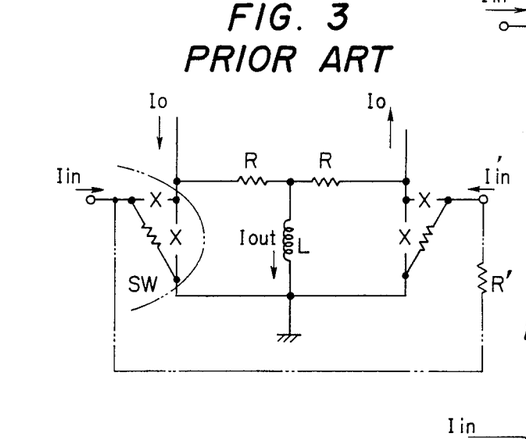

In the known example thus far described, it is known that a superconductive switch called "JAWS" (an abbreviation of Josephson Atto-Weber Switches), as shown in FIG. 2, is used in place of a mere junction as the switching device. (Reference should be made to: T. S. Stakelon, "Current switched Josephson latching logic gates with sub-100 ps delays", IEEE Trans. MAG-15, [6]1886(1979).) The operation of that switch is featured by that an input current $I_{in}$ is injected directly into an active portion but not by that an input is received in the form of a magnetic flux, as in the aforementioned junction switch. The HUFFLE circuit utilizing the JAWS as the switching device is called "JAWS-HUFFLE" and is shown in FIG. 3. According to the References cited hereinbefore, any one can be used as the "switching device" if it can take as a whole the two states, i.e., the super-conducting state (i.e., the zero voltage state) and the voltage state and if the current to flow through the switching device is sufficiently smaller than the current in the superconducting state. Therefore, the HUFFLE circuit can be constructed by using the CIL gate disclosed in U.S. Pat. No. 4,117,503 as the switching device.

Figure 4:
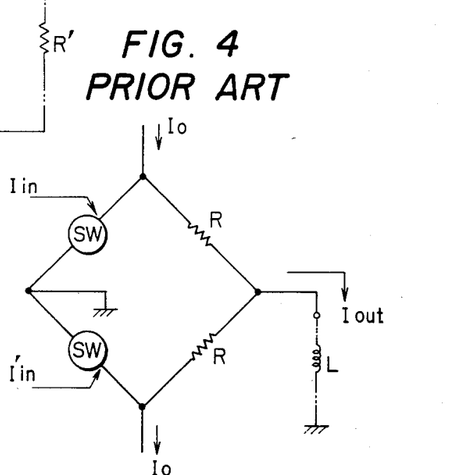

Within a range coming from the aforementioned examples or to be easily deduced therefrom, it is apparent that the HUFFLE circuit cannot be operated without preparing the "complementary input signals". In the aforementioned reference of T. A. Fulton, there is found a description that the HUFFLE circuit can be operated with one input by connecting two input terminals $I_{in}$ and $I_{in}'$ by means of a resistor R', as indicated by broken line in FIG. 3, instead of preparing those "complementary input sginals". However, it is not easy to design the circuit operating point therefor. Incidentally, all of the prior art examples thus far described can be considered, if summarized, to be a kind of the "bridge type logic circuit", in which the two superconducting switching devices SW and the two resistors are connected in the form of a Wheatstone bridge, as shown in FIG. 4.

SUMMARY OF THE INVENTION

It is, therefore, an object of the present invention to provide a d.c. power source driven bridge type logic circuit which has an input circuit construction requiring none of the "complementary input signals".

Another object of the present invention is to provide a superconducting logic circuit of high speed and high gain type, which can achieve logic functions such as AND or OR functions.

A superconducting logic circuit according to the characteristic construction of the present invention comprises: a first power source terminal connected with a current source; a second power source terminal connected with a current sink; a first superconducting switching device connected between said first power source terminal and the ground; a second superconducting switching device connected between said second power source terminal and the ground; first and second resistors connected with said first and second power source terminals, respectively; and third and fourth resistors connected with the control terminals of said first and second superconducting switching devices, respectively, wherein the other terminals of said first and second resistors are connected with each other to provide a logic circuit terminal, and wherein the other terminals of said third and fourth resistors are connected with each other to provide a logic input terminal.

When in actual use as the logic circuit, a plurality of logic inputs are connected with the aforementioned logic input terminal so that an OR or AND logic output of those inputs can be derived. On the other hand, a similar logic output can be derived if another input circuit composed of resistors similar to the aforementioned third and fourth resistors is connected in parallel with the input circuit composed of those third and fourth resistors such that the node of those input circuits provide a logic input terminal. In either case, the present invention is characterized in that the other terminals of the resistors which are connected with the first and second switching devices, respectively, are connected with each other to provide the logic input terminal.

According to the logic circuit of the present invention thus far described, a logic integrated circuit utilizing the Josephson junctions can be constructed and driven by a d.c. power source. Especially, the input lines can be made single so that an input can be impressed uniformly through the two switching devices and the two resistors. As a result, the circuit of the present invention can be made completely symmetric with respect to the grounded point so that the output can be balanced to zero at all times by the complete symmetry of the bridge in case there is no input signal.

DESCRIPTION OF THE PREFERRED EMBODIMENTS

Figure 5A:
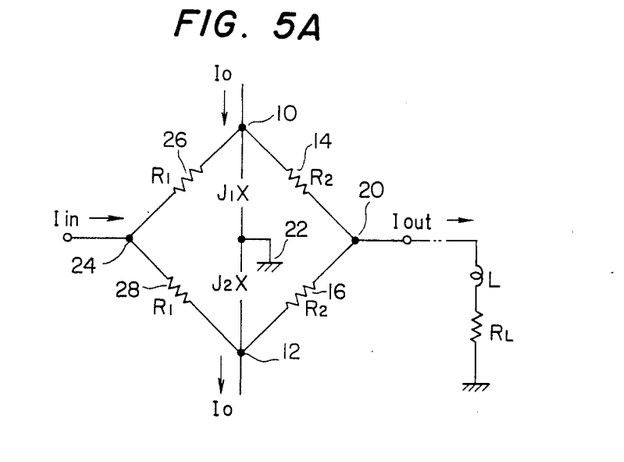
FIG. 5A is a diagram showing an embodiment of the superconducting logic circuit of the present invention.

FIG. 5A shows the fundamental circuit according to an embodiment of the present invention. A current source and a current sink are connected with a power source terminal 10 and a power source terminal 12, respectively. Josephson junctions J1 and J2 are connected between the power source terminal 10 and a grounded point 22 and between the power source terminal 12 and the grounded point 22, respectively. Between the power source terminal 10 and a logic output terminal 20 and between the power source terminal 12 and the logic output terminal 20, respectively, there are connected resistors 14 and 16, which have an equal resistance $R_2$. Between the power source terminal 10 and a logic input terminal 24 and between the power source terminal 12 and the logic input terminal 24, respectively, there are connected input resistors 26 and 28, which have a resistance $R_1$.

In FIG. 5A, when an input current $I_{in}$ (which is positive or negative) is impressed upon the logic input terminal 24, one junction (e.g., J1 or J2) has its internal current increased whereas the other junction (e.g., J2 or J1) has its internal current decreased. The current $I_o$ of the power source is so set that the two junctions are in the superconducting state (i.e., in the zero voltage state) for $I_{in}=0$. For $I_{in}\neq 0$, one of the junctions has its internal current increased to exceed the critical current (or maximum supercurrent) $I_m$ intrinsic thereto so that it can be switched to the voltage state. At this time, the other junction has its internal current failing to exceed the critical current $I_m$ so that it is in the superconducting state (i.e., in the zero voltage state). Incidentally, both the junctions are designed to have the equal critical current $I_m$. The output current $I_{out}$ at this time is characterized to be basically independent of the resistor $R_1$. More specifically, if the voltage to be generated at both the terminals of a junction is expressed by a function f and if that junction has a current $i_g$, the output current $I_{out}$ is expressed by the following Equation (by a d.c. analysis):

$$I_{out} = \frac{f(i_{r1}) - f(i_{r2})}{2R_L + R_2} \qquad (1)$$

Here, the letters $R_L$ indicates the resistance component of the load impedance and is allowed to be zero. (However, the setting of $R_L \neq 0$ increases the power consumption of the circuit but is effective to shorten the circuit delay time.) Moreover, letters $i_{g1}$ indicates an internal current to flow through the junction J1 toward the grounded point, and letters $i_{g2}$ indicates an internal current to flow through the junction J2 from the grounded point to the power source. The function f is approximated in the following form for simplicity:

$$f(i_g) = \begin{cases} V_g \text{ (in the voltage state)} \\ 0 \text{ (in the zero voltage state,} \\ \quad 0 \leq i_g \leq I_m). \end{cases} \quad (2)$$

Here, letters $V_g$ indicates the gap voltage of the junction, which has value determined by the superconducting material used. In the normal operational mode, the output of the circuit of the present invention can be expressed by setting:

$$\delta = \frac{1}{2(2R_L + R_2)} \quad (3)$$

in the following manners:

(i) $I_{in} > 0$, $f(i_{g2}) = 0$, $I_{out} = 2\delta V_g$. (4)

(ii) $I_{in} < 0$, $f(i_{g1}) = 0$, $I_{out} = -2\delta V_g$. (5)

Figure 5B:
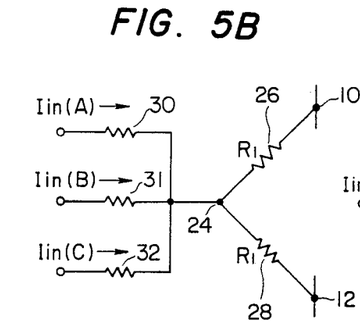
FIGS. 5B and 5C are circuit diagrams illustrating the input connecting methods of the circuit of FIG. 5A, respectively.
Figure 5C:
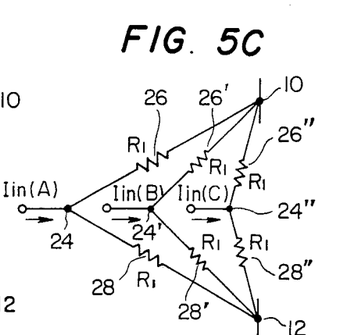

For $I_{in} = 0$, the circuit is in its stand-by state, and $f(i_{g1}) = f(i_{g2}) = 0$ and $I_{out} = 0$. In the erroneous operational mode, on the other hand, $f(i_{g1}) = f(i_{g2}) = V_g$ and $I_{out} = 0$ may occur. (This is called the "hung up" of the circuit and is generally devised by the design so that it may be obviated.) As is apparent from the Equations (1), (4) and (5), the output $I_{out}$ is independent of the resistance of the input resistor $R_1$ so long as the input resistors 26 and 28 are arranged symmetrically with respect to the grounded point, as shown in FIG. 5A. As a result, two (or more) input currents such as $I_{in}(A)$, $I_{in}(B)$ and $I_{in}(C)$ can be introduced as the circuit input system of the present invention by the connections shown in FIGS. 5B and 5C. At this time, the following Equation equivalently holds:

$$I_{in} = I_{in}(A) + I_{in}(B) + I_{in}(C). \quad (6)$$

In the connections of FIG. 5B, the logic input terminal 24 is fed through resistors 30, 31 and 32 with the input currents $I_{in}(A)$, $I_{in}(B)$ and $I_{in}(C)$, respectively. In the connections of FIG. 5C, on the other hand, a second input circuit composed of input resistors 26' and 28' and a third input circuit composed of input resistors 26'' and 28'' are connected in parallel with the input circuit composed of the input resistors 26 and 28, and their respective nodes provide the logic input terminals. A plurality of input logics such as AND or OR logics are assembled in either of the forms of FIGS. 5B and 5C.

The operational requirements for the circuit of the present invention will be described in detail in the following. By solving the circuit Equations, the internal currents $I_{g1}$ and $I_{g2}$ and the output current $I_{out}$ of the junctions J1 and J2 are written (by the d.c. solutions) in the following forms by defining the value $\delta$ in the following:

$$i_{g1} = \left(I_o + \frac{I_{in}}{2}\right) - 2\delta f(i_{g1}) - (\tau - \delta)\{f(i_{g1}) + f(i_{g2})\}, \quad (7)$$

$$i_{g2} = \left(I_o - \frac{I_{in}}{2}\right) - 2\delta f(i_{g2}) - (\tau - \delta)\{f(i_{g1}) + f(i_{g2})\}, \quad (8)$$

$$I_{out} = 2\delta\{f(i_{g1}) - f(i_{g2})\}, \quad (9)$$

$$\tau = \delta \times \frac{R_1 R_2 + 2R_L(R_1 + R_2) + R_2{}^g}{R_1 R_2}. \quad (10)$$

Here, the value $\delta$ is defined by the foregoing Equation (3) ($\Gamma > \delta$). At this time, the approximation of the Equation (2) is conducted for the function f, the currents $i_{g1}$, $i_{g2}$ and $I_L$ take the values, which are tabulated in Table 1, in dependence upon the values $f(i_{g1})$ and $f(i_{g2})$:

TABLE 1

| Situation | $f(i_{g1})$ | $f(i_{g2})$ | $i_{g1}$ | $i_{g2}$ | $I_{out}$ |
|---|---|---|---|---|---|
| 1 | 0 | 0 | $I_o + I_{in}/2$ | $I_o - I_{in}/2$ | 0 |
| 2 | $V_g$ | 0 | $\left(I_o + \frac{I_{in}}{2}\right) - (\tau + \delta)V_g$ | $\left(I_o - \frac{I_{in}}{2}\right) - (\tau - \delta)V_g$ | $2\delta V_g$ |
| 3 | 0 | $V_g$ | $\left(I_o + \frac{I_{in}}{2}\right) - (\tau - \delta)V_g$ | $\left(I_o - \frac{I_{in}}{2}\right) - (\tau + \delta)V_g$ | $-2\delta V_g$ |
| 4 | $V_g$ | $V_g$ | $\left(I_o + \frac{I_{in}}{2}\right) - 2\tau V_g$ | $\left(I_o - \frac{I_{in}}{2}\right) - 2\tau V_g$ | 0 |

First of all, in the "stand-by state" of $I_{in} = 0$ (i.e., a situation 1) of the circuit, in order that both the junctions J1 and J2 may be obviated from being in the voltage state and from being hung up, the following relationship is a first "necessary condition":

$$I = \geq I_o \quad (11)$$

In other words, the bias current of the power source should not exceed the critical current (i.e., the maximum superconducting tunnel current) $I_m$ intrinsic to the junctions. Next, for the switching requirement, in order that, for $|I_{in}| \neq 0$, one junction may be in the voltage state whereas the other may be in the zero voltage state (i.e., situations 2 and 3), the following relationships are required:

$$I_0 + \frac{|I_{in}|}{2} - (\tau + \delta)V_2 < I_m \leq I_0 - \frac{|I_{in}|}{2} - (\tau - \delta)V_2. \quad (12)$$

At this time, from the first and third terms of the Equation (12), the following inequality is deduced as the second "necessary condition":

$$|I_{in}| > 2\delta V_g. \quad (13)$$

Since the third term of the Equation (12) is trivial with the Equation (13), the following inequality becomes a third "necessary condition":

$$\frac{|I_{in}|}{2} > (I_m - I_0) + (\tau + \delta)V_2. \tag{14}$$

If the Equation (14) holds, the following inequalities are obtained:

$$\frac{|I_{in}|}{2} > I_m - I_0 > 0. \tag{15}$$

With the relationship of the Equation (15), when the input $I_{in}$ ($\neq 0$) is impressed (which should be referred to the situation 1), one of the following junction currents is transferred to the voltage state while exceeding the value $I_m$, whereas the other remains in the zero voltage state:

$$i_2 = I_0 \pm \frac{|I_{in}|}{2}. \tag{16}$$

In other words, the situation can be transferred from 2 and 3, and the circuit can be started.

From the description thus far made, it is understood that the necessary conditions for operating the circuit of the present invention can be expressed by the two Equations (11) and (14). [The necessary condition (13) is resultantly contained in the Equation (14).] Since $\Gamma > \delta$ holds, moreover, either if the following relationship more strict than the Equation (12) holds:

$$I_0 + \frac{|I_{in}|}{2} - 2\tau V_2 > I_m \geq I_0 - \frac{|I_{in}|}{2} - 2\tau V_2,$$

or if the following inequality in a rewritten form holds:

$$\frac{|I_{in}|}{2} > (I_m - I_0) + 2\tau V_2, \tag{17}$$

it is found that the "hung up" is reluctant to occur within the range to take no consideration into the dynamics of the circuit (Reference should be made to the values $I_{g1}$ and $i_{g2}$ of the situation 4.). With the necessary condition expressed by the inequality (13), therefore, the following inequality holds with reference to the Table 1:

$$|I_{in}| > |I_{out}|. \tag{18}$$

In the present circuit, the output current $|I_{out}|$ becomes smaller than the total input current. In order to improve this, it is sufficient to use not a single junction but a CIL gate or a switching device to be detailed to generate a gain as the switching device.

Next, the embodiment for operating the circuit of the present invention as the OR or AND of two inputs will be described in the following. In this embodiment, the construction shown in FIG. 5B or 5C is adopted as the input connections so that the three paired inputs $I_{in}(A)$, $I_{in}(B)$ and $I_{in}(C)$ may be introduced. The levels of those input currents are normalized with reference to the necessary condition (14), as follows:

$$I_{det} = 2\{(I_m - I_o( + (\Gamma + \delta)V_g\}. \tag{19}$$

when the absolute value of the following total input current exceeds a value $I_{det}$, the circuit is operated:

$$I_{in} = I_{in}(A) + I_{in}(B) + I_{in}(C). \tag{20}$$

Here, the design is made such that the "unit input" is $\pm 1.2\, I_{det}$ and that no zero input occurs during the operation. The logic value "1" becomes the input of 1.2 $I_{det}$, whereas the logic value "0" becomes the input of $-1.2\, I_{det}$. On the other hand, the output is considered to correspond to the logic value "1" for the current of 2 $\delta V_g$ and the logic value "0" for the current of $-2\, \delta V_g$. Here, the output responses when various logic values are fed to the respective inputs A, B and C are as follows (Table 2): In other words, the circuit of the present invention constructs the majority logic for the three inputs A, B and C in accordance with the Equation (20). Therefore, if the input of $I_{in}(C) = 1.2I_{det}$ is fed at all times, the OR operation of the two inputs A and B can be effected (i.e., the situations 1 to 4 of the Table 2). Incidentally, the inputs are expressed by using the $I_{det}$ as one unit current, and the logic values are expressed by circled numerals:

TABLE 2

| Situation | $I_{in}$ (A) | | $I_{in}$ (B) | | $I_{in}$ (C) | | Total $I_{in}$ | $I_{o\sigma i}$ | | Remarks |
|---|---|---|---|---|---|---|---|---|---|---|
| 1 | 1.2 | 1 | 1.2 | 1 | 1.2 | 1 | 3.6 | 2$\delta V_\sigma$ | 1 | OR Operations |
| 2 | 1.2 | 1 | −1.2 | 0 | 1.2 | 1 | 1.2 | 2$\delta V_\sigma$ | 1 | for Inputs |
| 3 | −1.2 | 0 | 1.2 | 1 | 1.2 | 1 | 1.2 | 2$\delta V_\sigma$ | 1 | A & B |
| 4 | −1.2 | 0 | −1.2 | 0 | 1.2 | 1 | −1.2 | −2$\delta V_\sigma$ | 0 | |
| 5 | None | | None | | 1.2 | 1 | 1.2 | 2$\delta V_\sigma$ | 1 | Stand-by for OR Operation |
| 6 | 1.2 | 1 | 1.2 | 1 | −1.2 | 0 | 1.2 | 2$\delta V_\sigma$ | 1 | AND Operations |
| 7 | 1.2 | 1 | −1.2 | 0 | −1.2 | 0 | −1.2 | −2$\delta V_\sigma$ | 0 | for Inputs |
| 8 | −1.2 | 0 | 1.2 | 1 | −1.2 | 0 | −1.2 | −2$\delta V_\sigma$ | 0 | A & B |
| 9 | −1.2 | 0 | −1.2 | 0 | −1.2 | 0 | −3.6 | −2$\delta V_\sigma$ | 0 | |
| 10 | None | | None | | −1.2 | 0 | −1.2 | −2$\delta V_\sigma$ | 0 | Stand-by for AND Operation |
| 11 | None | | None | | None | | 0 | 0 | | Stand-by No Input |

On the other hand, if the input $I_{in}(C) = -1.2I_{det}$ is fed at all times, the AND operation for the two inputs A and B can be effected (i.e., the situations 6 to 9 of the Table 2). The situations 5 and 10 of the Table 2 the stand-by states for the OR and AND operations, Likewise, the situation 11 indicates that the output becomes zero when only the power source current $I_o$ is impressed so that no current signal is fed to all the input terminals (A, B and C).

Next, the superconducting switching device which is the most proper for use in the logic circuit of the present invention will be described in detail with reference to FIGS. 6A and 6B. This switching device is used in place of the Josephson junctions J1 and J2 in the aforementioned circuit of the present invention. That switching circuit can also be applied to the HUFFLE circuit known in the prior art. Moreover, the switching circuit can be used as the circuit element of the so-called "a.c. power source drive type", which is not d.c. power source drive but reduces the power source current each time one logic calculation is finished.

Figure 6A:
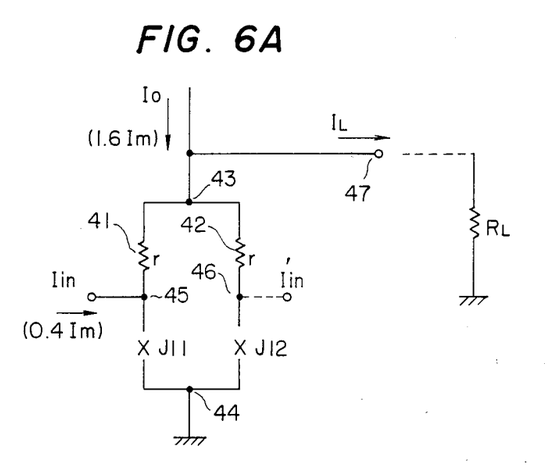
FIGS. 6A and 6B are circuit diagrams showing examples of the switching device to be used in the superconducting logic circuit of the present invention.

First of all, the switching device shown in FIG. 6A is constructed by connecting in parallel a series circuit, which is composed of a Josephson junction J11 and a resistor 41 having a resistance r, and a series circuit which is composed of a Josephson junction J12 and a resistor 42 having the resistance r. The parallel connection thus constructed is grounded at its node 44 at the Josephson junction side and is connected with a current source (or a current sink) at its node 43 at the resistor side. The node 45 between the resistor 41 and the junction J11 and/or the node 46 between the resistor 42 and the junction J12 are used as an input terminal or input terminals, into which the input current $I_{in}$ is injected. The direction of this current is designed to be positive or negative. The output signal current $I_L$ is derived from the output terminal 47 which leads to the node 43 between the current source (or the current sink) and that parallel connection.

Figure 6B:
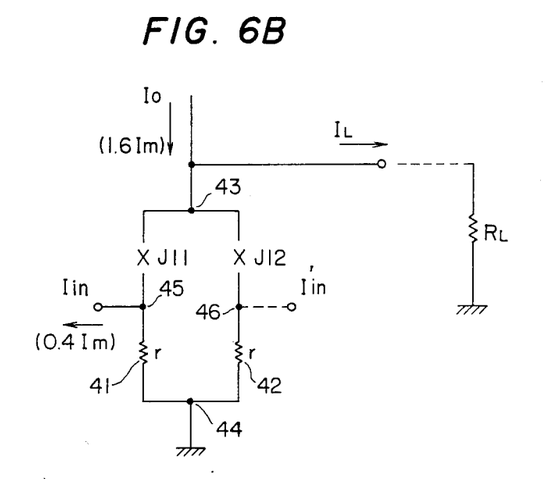

On the other hand, the switching device shown in FIG. 6B has a construction similar to that of the switching device of FIG. 6A except that the grounded terminal and the power source terminal are replaced by each other.

The operations of those switching devices will be first described by using simple numerical values by way of example. (If the internal current of the junction exceeds the value $I_m$, the junction is transferred from the superconducting state or the zero voltage state to the voltage state.) Now, if a power source current of $I_o = 1.6I_m$ is used, both the junctions J11 and J12 allow, when supplied with no input, the current of $0.8I_m$ to flow therethrough so that they are in the zero voltage state. At this time, if an input current of $I_{in} = 0.4I_m$ is injected in a direction to increase the internal current of the junction J1, an internal current as large as $1.2I_m$ flows through one junction J11 at that instant so that the junction J11 is transferred to the voltage state. If, at this time, the internal current of said junction J11 is thought to be approximately zero, a current of $2.0I_m$ flows through the inside of the other junction J12. As a result, the junction J12 is subsequently transferred to the voltage state. Since both the junctions J11 and J12 are at the voltage states so that a little current flows therethrough, most of the power source current of $I_0 = 1.6I_m$ can flow out of the output terminal 47. For ensuring this operation, the load resistor $R_L$ (or the impedance) connected with the output terminal 47 should not be excessively low. At this time, if the ratio of $I_L/I_{in}$ is called the "gain", the gain takes a value 4 so that a larger output current than the input is generated, as is apparent from the foregoing description.

The operating conditions of that switching device will be described in detail in the following by making use of equations. If the circuit equations are solved, the output current $I_L$ and the internal currents $i_1$ and $i_2$ of the junctions J11 and J12 can be written in the following forms (by the d.c. analysis). Reference symbols and approximations are used to follow those of the foregoing circuit example:

$$i_1 = I_{in} + P\{I_o + (f_1 + f_2)/r\} - f_1/r. \quad (21)$$

$$i_2 = p\{I_o + (f_1 + f_2)/r\} - f_2/r. \quad (22)$$

$$I_L = q\{I_o + (f_1 + f_2)/r\}. \quad (23)$$

Here, the letters p and q are defined by the following Equations:

$$p = R_L/(2R_L + r), \quad q = r/(2R_L + r). \quad (24)$$

On the other hand, the letters $f_1$ and $f_2$ are abbreviations of the functions $f(i_1)$ and $f(i_2)$. The letters p and q are abbreviations of p(2) and q(2). At this time, if the approximation of the Equation (2) is conducted for the function f, the currents $i_1$, $i_2$ and $I_L$ take the values tabulated in Table 3. The foregoing Equations are common and mathematically equivalent if the direction of the current $I_{in}$ is defined to be indicated by arrows in FIGS. 6A and 6B:

TABLE 3

| Situation | $f(i_1)$ | $f(i_2)$ | $i_1$ | $i_2$ | $I_L$ |
|---|---|---|---|---|---|
| 1 | 0 | 0 | $I_{in} + pI_o$ | $pI_o$ | $qI_o$ |
| 2 | $V_o$ | 0 | $I_{in} + pI_o - (1-p)V_o/r$ | $p(I_o + V_o/r)$ | $q(I_o + V_o/r)$ |
| 3 | 0 | $V_o$ | $I_{in} + p(I_o + V_o/r)$ | $pI_o - (1-p)V_o/r$ | $q(I_o + V_o/r)$ |
| 4 | $V_o$ | $V_o$ | $I_{in} + pI_o - (1-2p)V_o/r$ | $pI_o - (1-2p)V_o/r$ | $q(I_o + 2V_o/r)$ |

On the basis of those calculations, the necessary conditions for switching the switching device to be used in the present invention are determined. First of all, in the "stand-by state" of $I_{in} = 0$ of the switching device (i.e., in the situation 1), in order that both the junctions J11 and J12 may be prevented from being brought into the voltage state and from being hung up, $p(2)I_o \leq I_m$, i.e., the following relationship is the first "necessary condition":

$$R_L I_o \leq (2R_L + r)I_m. \quad (25)$$

At this time, the junctions J11 and J12 can stand by in the zero voltage state. Next, for $I_{in} > 0$, in order the junction J11 is brought into the voltage state, $p(2)I_o + I_{in} > I_m$, i.e., the following relationship is necessary, which provides the second "necessary condition:

$$R_L I_o > (2R_L + r)(I_m - I_{in}). \quad (26)$$

More specifically, if the current $I_{in}$ satisfying Inequality (26) is fed, the junction J11 is transferred from the situation 1 ($f(i_1) = 0$) to the situation 2 ($f(i_1) = V_g$) tabulated in Table 3. In accordance with this transfer, the value $i_1$ is decreased from its initial value whereas the value $i_2$ is increased, as is tabulated in the column of the situation 2 of the Table 3. However, the junction J11 is maintained at the voltage state. If, at this stage, the other junction J12 is transferred to the voltage state, the desired switching operation is effected. The necessary condition therefor is that the value $i_2$ exceeds $I_m$, and $p(2) \times (I_o + V_g/r) > I_m$, i.e., the following inequality is deduced as the third "necessary condition" from the following inequality:

$$R_L(I_o+V_r/r)>(2R+r)I_m. \qquad (27)$$

If this condition is satisfied, the switching device is started by the input $I_{in}(>0)$ in the course of the situations 1, 2 and 4. At this time, the values $i_1$ and $i_2$ are increased and decreased, as tabulated in the column of the situation 4 of the Table 3, but both the junctions are maintained in the voltage state. The output to be finally derived from that switching device is equal to $q(2)\times(I_o+2V_g/r)$, i.e., the following Equation:

$$I_L=\{r/(2R_L+r)\}(I_o+2V_r/r). \qquad (28)$$

As has been described hereinbefore, the necessary conditions for operating the switching device used in the present invention are expressed by the Equations (25), (26) and (27). More specifically, if the power source current satisfying the Equations (25) and (27) is selected and if the current $I_{in}$ satisfying the Equation (26) is impressed, the switching device of the present invention can accomplish the desired operations. Now, if $R_L>>r$ is assumed in a very simple example, $p(2)\approx\frac{1}{2}$ holds. Hence, those three Equations can be summarized in the following forms:

$$\left(\frac{I_o}{2I_m}+\frac{I_{in}}{I_m}\right)>1, \qquad (29)$$

$$2\geq\frac{I_o}{I_m}>\left(2-\frac{V_g}{rI_m}\right). \qquad (30)$$

Figure 7A:
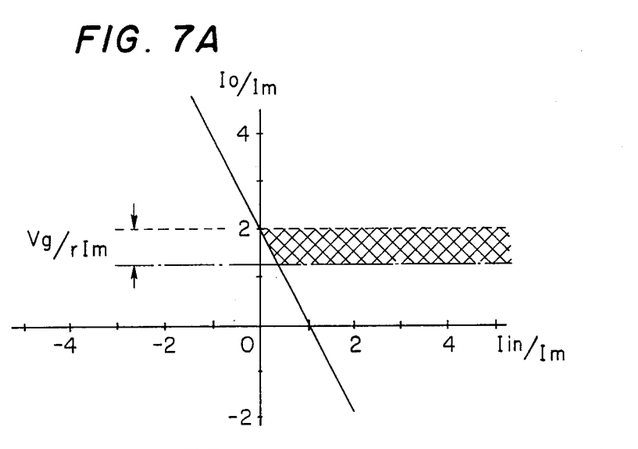
FIGS. 7A and 7B are graphs for explaining the operational requirements of the switching devices of FIGS. 6A and 6B, especially, the ranges of set parameters.

The range of a combination of variable, $(I_{in}, I_o)$, satisfying these Inequalities is given by the hatched portion appearing in FIG. 7A. In other words, if the power source current is selected to be at the value $I_o$ satisfying the Inequality (3), that switching device accomplish the desired operations. On the other hand, moreover, $p(2)=\frac{1}{3}$ holds in the example for selecting $R_L=r$. Hence, the Equations (25), (26) and (27) are summarized in the following forms:

$$\left(\frac{I_o}{3I_m}+\frac{I_{in}}{I_m}\right)>1, \qquad (31)$$

$$3\geq\frac{I_o}{I_m}>\left(3-\frac{V_g}{rI_m}\right). \qquad (32)$$

Figure 7B:
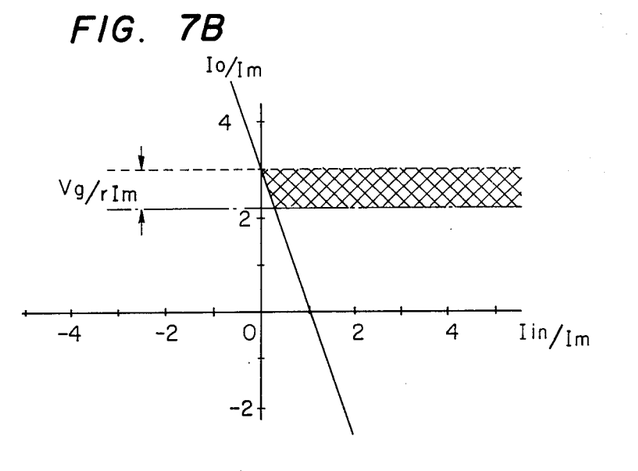

The ranges of $(I_{in}, I_o)$ satisfying these Inequalities are given by the hatched portion appearing in FIG. 7B. Since, at this time, $q(2)=\frac{1}{3}$ holds, the output current expressed by the following Equation is derived:

$$I_L=\frac{1}{3}(I_o+2V_2/r). \qquad (33)$$

If a suitable operating point is selected, it is possible to select the logic swing of $2q(2)V_g/r$ of the output at a higher level than the input $I_{in}$. The calculated results thus far obtained can be applied to both the switching devices shown in FIGS. 6A and 6B. Here, the direction of $I_{in}(>0)$ is the direction of the source in FIG. 6A and the direction of the sink in FIG. 6B.

The switching devices thus far described with reference to FIGS. 6A and 6B are directed to the example, in which two combinations of the resistor and the Josephson junction are connected in parallel. However, that construction can be extended to a general one in which an N number of combinations are connected in parallel. If the switching device is composed of the $N(N\geq 2)$ number of the combinations, the output current obtainable can be generally increased in relation to the number N.

In the example of the switching device adopting the N number of the parallel circuits, the input current $I_{in}$ is assumed to be impressed upon the first portion. At this time, the first current $i_1$, the kth current $i_k$ and the load current $I_L$ are expressed by the following Equations, respectively:

$$i_1 = I_{in} + p\left(I_o + \frac{\sum_{j=1}^{N} f_j}{r}\right) - \frac{f_1}{r}, \qquad (34)$$

$$i_k = P\left(I_o + \frac{\sum_{j=1}^{N} f_j}{r}\right) - \frac{f_k}{r}, \qquad (35)$$

$$I_L = q\left(I_o + \frac{\sum_{j=1}^{N} f_j}{r}\right). \qquad (36)$$

Here, $j=1,---,N$, and $k=2,---,N$, and the following definitions are made:

$$P(N) = \frac{R_L}{NR_L+r}, \quad q(N) = \frac{r}{NR_L+r}. \qquad (37)$$

On the other hand, letters $f_l$ and $f_j$ are abbreviations of the functions $f(i_l)$ and $f(i_j)$. Letters p and q are abbreviations of p(N) and q(N). At this time, the approximation of the Equation (2) is conducted for the function f.

The switching requirement for the switching device using the N number of parallel circuits can be given by the following three relationships likewise of the Equations (25), (26) and (27) for N=2. That is to say:

From $p(N)I_o\leq I_m$:

$$R_L I_o \leq (NR+r)I_m. \qquad (38)$$

From $p(N)I_o+I_{in}=I_m$:

$$R_L I_o>(NR+r)(I_m-I_{in}). \qquad (39)$$

From $P(N)[I_o+V_g/r]>I_m$:

$$R_L(I_o+V_g/r)>(NR_L+r)I_m. \qquad (40)$$

The output current when the switching operation takes place so that all the junctions are in the voltage state is deduced by the following Equation:

$$I_L=(rI_o+NV_g)/(NR_L+r). \qquad (41)$$

The increment of the output $I_L$ by the input current $I_{in}(\neq 0)$ is given by $NV_g/(NR_L+r)$, which can be increased the higher as the value $N(\geq 2)$ becomes the larger.

Incidentally, the switching devices thus far described are directed to the example, in which the inut current $I_{in}$ is impressed upon only the first junction. However, like effects can be obtained if the input current is fed to one of the other parallel portion or simultaneously to the plural portions.

Figure 8:
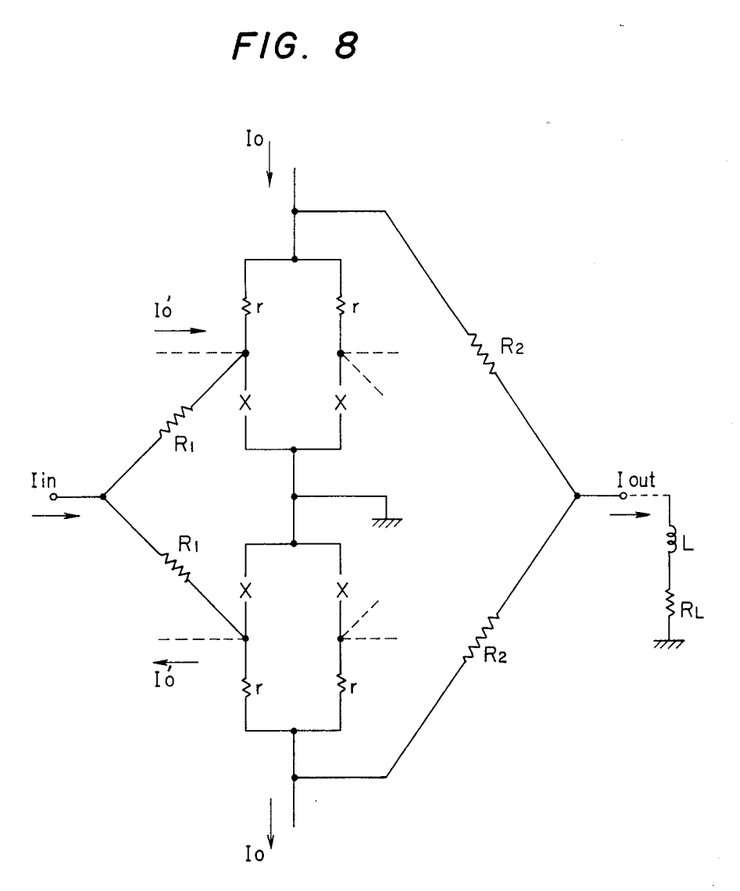
FIGS. 8 and 9 are diagrams showing other embodiments of the superconducting logic circuit of the present invention, respectively.
Figure 9:
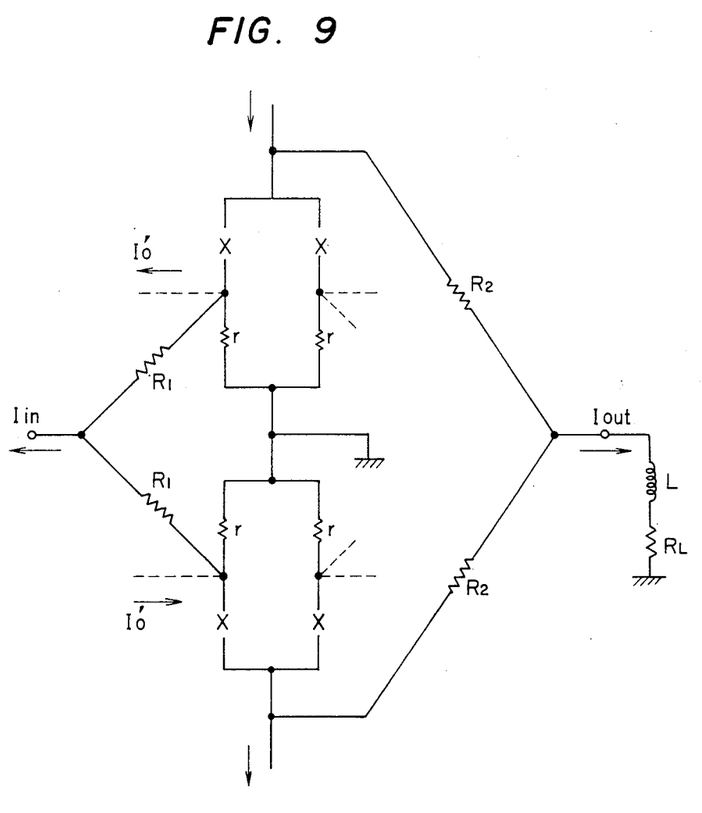

If the switching devices shown in FIGS. 6A and 6B are applied to the logic circuit shown in FIG. 5A, the connections of FIGS. 8 and 9 are obtained, respectively. In these examples, the single junctions J1 and J2 of FIG. 5A are replaced by the switching device of FIG. 6A or 6B. It is apparent that the operations of the aforementioned majority, AND and OR logics can be effected at high gains by those combinations. In the logic circuit of FIG. 5A, incidentally, the aforementioned CIL gate may be adopted as the switching device thereby to have a construction similar to that of FIG. 8. In this modification, the resistor r of FIG. 8 takes a form in which it is replaced by an inductance.

What is claimed is:

1. A superconducting logic circuit comprising:
a first power source terminal connected with a current source;
a second power source terminal connected with a current sink;
a first superconducting switching device connected between said first power source terminal and ground, said first superconducting switching device having a control terminal;
a second superconducting switching device connected between said second power source terminal and ground, said second superconducting switching device having a control terminal;
first and second resistors having one terminal thereof connected with said first and second power source terminals, respectively; and
third and fourth resistors having one terminal thereof connected with the control terminals of said first and second superconducting switching devices, respectively,
wherein said first and second resistors have another terminal thereof connected with each other at a node to provide a logic output terminal, and
wherein said third and fourth resistors have another terminal thereof connected with each other at a node to provide a logic input terminal.

2. A superconducting logic circuit as set forth in claim 1, wherein said first and second resistors have an equal resistance.

3. A superconducting logic circuit as set forth in claim 1, wherein said third and fourth resistors have an equal resistance.

4. A superconducting logic circuit as set forth in claim 1, whrein said first and second superconducting switching devices are Josephson junctions each of which has the control terminal thereof connected with said first and second power source terminals, respectively, and another terminal thereof grounded.

5. A superconducting logic circuit as set forth in claim 1, further comprising a plurality of resistors having one terminal thereof connected with the node of said third and fourth resistors and having other terminals thereof providing respective logic input terminals.

6. A superconducting logic circuit as set forth in claim 1, wherein said third resistor includes a plurality of input resistors having one terminal thereof connected with the control terminal of said first superconducting switching device, wherein said fourth resistor includes a plurality of input resistors having one terminal thereof connected with the control terminal of said second superconducting switching device, and wherein the plurality of input resistors composing said third resistor and the plurality of input resistors composing said fourth resistor have another terminal thereof connected respectively with each other thereby to provide logic input terminals, respectively.

7. A superconducting logic circuit as set forth in claim 6, wherein all of the plurality of input resistors have an equal resistance.

8. A superconducting logic circuit as set forth in claim 1, wherein each of said first and second superconducting switching circuits includes a plurality of circuit units which are connected in parallel and each of which has one Josephson junction and a resistor connected in series with said Josephson junction, and wherein the node between the Josephson junction and the resistor of at least one of said circuit units provides the control terminal.

9. A superconducting logic circuit as set forth in claim 8, wherein said plural circuit units are connected with either of said first and second power source terminals at a common terminal of the Josephson junctions and are grouned at a common terminal of the resistors.

10. A superconducting logic circuit as set forth in claim 8, wherein said plural circuit units are connected with either of said first and second power source terminals at a common terminal of the resistors and are grounded at a common terminal of the Josephson junctions.

* * * * *